United States Patent
Ren et al.

(10) Patent No.: US 8,058,924 B1
(45) Date of Patent: Nov. 15, 2011

(54) METHOD AND APPARATUS FOR A PROCESS, VOLTAGE, AND TEMPERATURE VARIATION TOLERANT SEMICONDUCTOR DEVICE

(75) Inventors: Guo Jun Ren, San Jose, CA (US); Prasad Rau, Portland, OR (US); Jian Tan, Fremont, CA (US); Qi Zhang, Chandler, AZ (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/361,804

(22) Filed: Jan. 29, 2009

(51) Int. Cl.
G05F 1/10 (2006.01)
G05F 3/02 (2006.01)

(52) U.S. Cl. ......... 327/540; 327/538; 323/315; 323/316

(58) Field of Classification Search .......... 327/108–112, 327/379, 389, 391, 530, 538–543, 546; 326/22–27, 326/81–87; 323/312–317
See application file for complete search history.

(56) References Cited

U.S. PATENT DOCUMENTS

| | | | | |
|---|---|---|---|---|
| 5,172,073 A * | 12/1992 | Fujii | ............. | 330/255 |
| 5,519,309 A * | 5/1996 | Smith | ............. | 323/316 |
| 5,621,357 A * | 4/1997 | Botti et al. | ............. | 330/253 |
| 5,990,711 A * | 11/1999 | Sekimoto | ............. | 327/112 |
| 6,504,397 B1 | 1/2003 | Hart et al. | | |
| 6,630,863 B2 * | 10/2003 | Tsuchiya | ............. | 330/254 |
| 7,071,739 B1 | 7/2006 | Duzevik et al. | | |
| 7,098,904 B2 * | 8/2006 | Kato | ............. | 345/211 |
| 7,330,056 B1 * | 2/2008 | Lu | ............. | 327/108 |
| 7,635,990 B1 * | 12/2009 | Ren et al. | ............. | 326/86 |
| 2002/0109525 A1 * | 8/2002 | Shin | ............. | 326/26 |
| 2005/0007150 A1 * | 1/2005 | Omote | ............. | 326/83 |
| 2005/0248391 A1 * | 11/2005 | Itoh | ............. | 327/540 |
| 2006/0232326 A1 * | 10/2006 | Seitz et al. | ............. | 327/539 |
| 2007/0279105 A1 * | 12/2007 | Sunairi | ............. | 327/108 |
| 2008/0001592 A1 * | 1/2008 | Conte et al. | ............. | 323/316 |
| 2008/0018318 A1 * | 1/2008 | Hsu | ............. | 323/315 |
| 2008/0180130 A1 * | 7/2008 | Hayami et al. | ............. | 326/30 |
| 2008/0204120 A1 * | 8/2008 | Park | ............. | 327/530 |
| 2009/0051416 A1 | 2/2009 | Ibuka | | |
| 2009/0091357 A1 * | 4/2009 | Muniyappa et al. | ......... | 327/108 |
| 2009/0195302 A1 | 8/2009 | Lin et al. | | |

OTHER PUBLICATIONS

U.S. Appl. No. 12/175,925, filed Jul. 18, 2008, Ren et al.
U.S. Appl. No. 12/362,412, filed Jan. 29, 2009, Ren et al.
U.S. Appl. No. 12/362,417, filed Jan. 29, 2009, Ren et al.

* cited by examiner

*Primary Examiner* — Lincoln Donovan
*Assistant Examiner* — Brandon Cole
(74) *Attorney, Agent, or Firm* — Michael T. Wallace; John J. King

(57) ABSTRACT

A method and apparatus to reduce the degradation in performance of semiconductor-based devices due to process, voltage, and temperature (PVT) and/or other causes of variation. Adaptive feedback mechanisms are employed to sense and correct performance degradation, while simultaneously facilitating configurability within integrated circuits (ICs) such as programmable logic devices (PLDs). A voltage-feedback mechanism is employed to detect PVT variation and mirrored current references are adaptively adjusted to track and substantially eliminate the PVT variation. More than one voltage-feedback mechanism may instead be utilized to detect PVT-based variations within a differential device, whereby a first voltage-feedback mechanism is utilized to detect common-mode voltage variation and a second voltage-feedback mechanism produces mirrored reference currents to substantially remove the common-mode voltage variation and facilitate symmetrical operation of the differential device.

20 Claims, 7 Drawing Sheets

METHOD AND APPARATUS FOR A PROCESS, VOLTAGE, AND TEMPERATURE VARIATION TOLERANT SEMICONDUCTOR DEVICE

FIELD OF THE INVENTION

The present invention generally relates to semiconductor devices, and more particularly to semiconductor devices that exhibit performance parameters that are substantially independent of process, voltage, and temperature variation.

BACKGROUND OF THE INVENTION

Advances in the field of semiconductor integrated circuits (ICs) have brought about higher levels of integration. Accordingly, semiconductor manufacturing process advancements are driving the corresponding geometric dimensions of semiconductor devices to decreasingly smaller values. 10 micrometer (μm) gate lengths, for example, were common in the 1970's, but continuously advancing semiconductor manufacturing processes have reduced gate lengths to well below 100 nanometers (nm) for deep sub-micron integrated circuit (IC) design.

One key challenge presented by deep sub-micron design is the adjustment of the various semiconductor processing steps that are required to implement devices within a silicon die so as to obtain acceptable yield and manufacturability. While such process adjustments may optimize operating parameters at a particular process corner, the process adjustments may nevertheless produce degraded operating parameters at other process corners.

Operating parameters, such as transistor threshold voltage, leakage current, and saturation current, for example, may be so affected by the process variations that performance of the devices no longer corresponds to design specifications previously verified within the design/simulation environment. As a result, process variations that optimize yield and manufacturability may also contribute to detrimental effects on device performance, such as increased leakage current, reduced threshold voltage, and/or increased saturation current.

As geometric features of the deep sub-micron devices continue to shrink, scaling, implant, and annealing process variations invoke increasingly significant device performance degradations. Reducing the effects of such process-based performance variations have conventionally been implemented either by specifically designing the semiconductor processing steps to minimize process-induced performance degradation, or by changing the equipment used during one or more of the semiconductor processing steps.

Voltage and temperature variation, however, may also lead to variations that degrade performance of the semiconductor device over all process, voltage, and temperature (PVT) corners. As a result, a device that exhibits acceptable performance levels at a first PVT corner, may nevertheless exhibit performance degradations at other PVT corners that are dynamically induced.

Efforts continue, therefore, to devise alternate solutions to mitigate the effects of PVT variation on device performance.

SUMMARY OF THE INVENTION

To overcome limitations in the prior art, and to overcome other limitations that will become apparent upon reading and understanding the present specification, various embodiments of the present invention disclose a method and apparatus to mitigate the effects of process, voltage, and temperature (PVT) variation.

In accordance with one embodiment of the invention, a method of providing process, voltage, and temperature variation tolerance within a semiconductor device comprises establishing a variation tolerant voltage signal at a selected node within a first device, conducting a first variation tolerant current signal through the selected node, mirroring the first variation tolerant current signal to conduct a second variation tolerant current signal, generating a bias voltage from the second variation tolerant current signal, and programmably applying the bias voltage to control a slew rate of a second device.

In accordance with another embodiment of the invention, a bias signal generator comprises a reference generator that is adapted to provide a reference voltage that is substantially independent of process, voltage, and temperature variation. The bias signal generator further comprises an operational amplifier having a first input that is coupled to receive the reference voltage and an output that is adapted to provide a first bias signal, where the first bias signal is also substantially independent of process, voltage, and temperature variation. The bias signal generator further comprises a first current conduction device that is coupled to receive the first bias signal and is adapted to conduct a first current signal in response to the first bias signal. A magnitude of the first current signal is adapted to be substantially independent of process, voltage, and temperature variation. The bias signal generator further comprises a second current conduction device that is coupled to receive the first bias signal and is adapted to conduct a second current signal in response to the first bias signal. A magnitude of the second current signal is adapted to be proportional to a magnitude of the first current signal.

In accordance with another embodiment of the invention, an integrated circuit comprises an output buffer that is coupled to receive a data signal from a core of the integrated circuit and is adapted to transmit the data signal and a slew-rate control block that is coupled to provide first and second bias signals to the output buffer that are substantially independent of process, voltage, and temperature variation. The slew-rate control block includes a first current conduction device that is coupled to receive the first bias signal and is adapted to conduct a first current signal in response to the first bias signal. A magnitude of the first current signal is adapted to be substantially independent of process, voltage, and temperature variation. The slew-rate control block further includes a second current conduction device that is coupled to receive the first bias signal and is adapted to conduct a second current signal in response to the first bias signal. A magnitude of the second current signal is adapted to be proportional to a magnitude of the first current signal.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to reduce the degradation in performance of semiconductor-based devices due to process, voltage, and temperature (PVT) and/or other causes of variation. Adaptive feedback mechanisms are employed to sense and correct performance degradation, while simultaneously facilitating configurability that is necessary within integrated circuits (ICs) such as programmable logic devices (PLDs).

In one embodiment, a voltage-feedback mechanism is employed within a pre-driver of a PLD-based output buffer to detect PVT variation. In response, mirrored current references are adaptively adjusted to track and substantially eliminate the PVT variation. As a result, PVT variation-based slew-rate degradation may be substantially eliminated in accordance with one embodiment of the present invention.

In an alternate embodiment of the present invention, voltage-feedback mechanisms are utilized to detect PVT-based variations within a driver of an output buffer. In particular, a first voltage-feedback mechanism is utilized to detect common-mode voltage variation within a differential driver of the output buffer. A second voltage-feedback mechanism produces mirrored reference currents to substantially remove the common-mode voltage variation.

In yet another embodiment, the operation of a differential driver is adapted to substantially eliminate PVT variation-based performance degradation by utilizing a replica of the differential driver to form a common-mode feedback loop. The replica may be scaled in size with respect to the main driver so as to reduce power consumption and semiconductor die area. Two operational amplifiers (op amps) are used to detect voltage variations within the replica and in response, bias signals are generated within the replica and main driver to compensate for the voltage variations.

Figure 1:
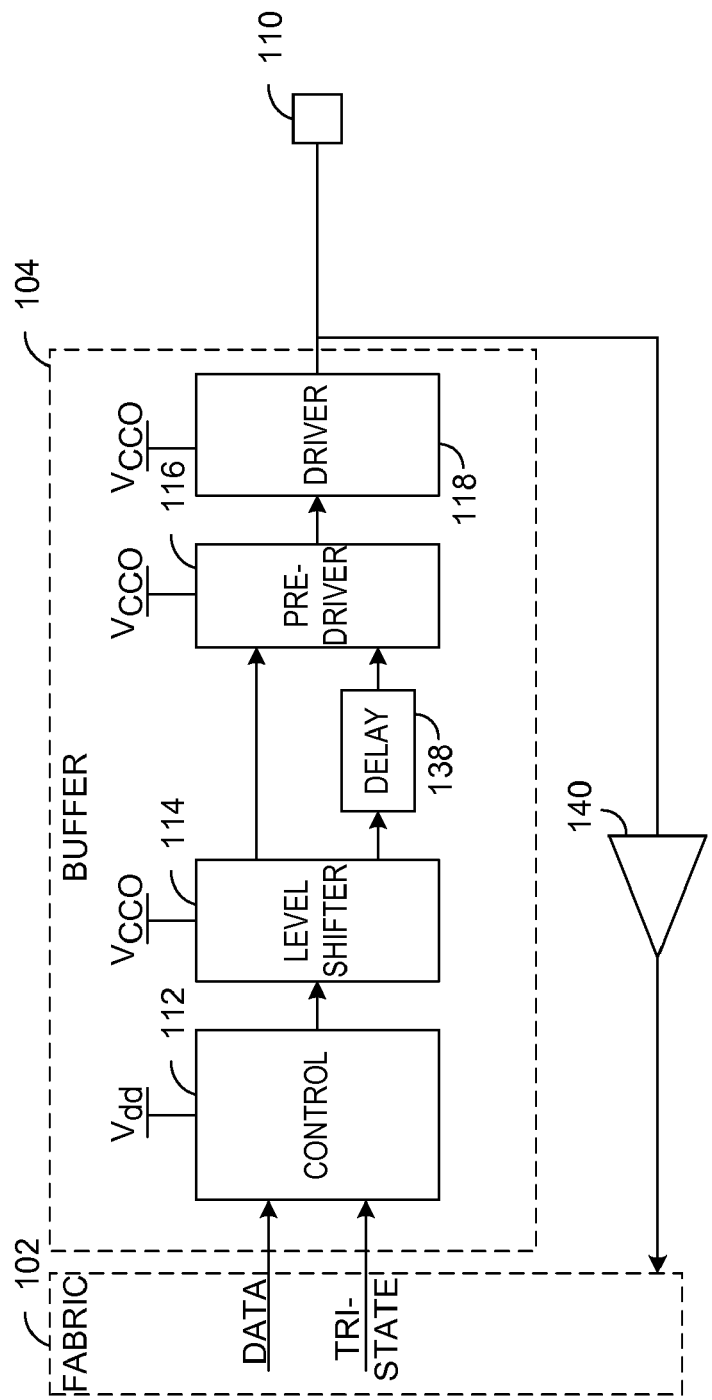
FIG. 1 illustrates a block diagram of an exemplary semiconductor device that may exhibit performance degradation induced by process, voltage, and temperature (PVT) variation.

Turning to FIG. 1, a block diagram of a semiconductor-based device, such as an input/output (I/O buffer), is illustrated, where the I/O buffer may be subject to PVT and/or other sources of variation. The block diagram of FIG. 1 illustrates components of a field programmable gate array (FPGA)-based I/O buffer that may be configured to support single-ended I/O standards, such as low-voltage complementary metal oxide semiconductor (LVCMOS), low-voltage transistor-transistor logic (LVTTL), high-speed transceiver logic (HSTL), stub-series terminated logic (SSTL), gunning transceiver logic (GTL), and peripheral component interface (PCI). As discussed in more detail below, variations of each single-ended I/O standard may be implemented through appropriate configuration of the I/O buffer. Slew-rate control, for example, may be configured within pre-driver 116 through appropriate programming of configuration memory cells associated with pre-driver 116.

The I/O buffer of FIG. 1 is representative of an I/O buffer that may exist within an FPGA, where fabric 102 may be configured to generate signal TRI-STATE, so as to enable, or disable, output buffer 104. Similarly, fabric 102 may provide signal DATA to output buffer 104 given that output buffer 104 is enabled by signal TRI-STATE. It should be noted that while the I/O buffer of FIG. 1 may generate an output signal at output pad 110 that is related to signal DATA, input buffer 140 may be similarly operated to receive a signal from input pad 110 and in response, provide the received data signal to fabric 102.

Control block 112 operates at core voltage, e.g., $V_{dd}$, which is the same operational voltage magnitude that is utilized by fabric 102. Since pre-driver 116 and driver 118 operate at a relatively higher voltage magnitude, e.g., $V_{CCO}$, level shifter block 114, which translates data and delayed data operating at the core voltage magnitude, e.g., $V_{dd}$, to data and delayed data operating at the I/O voltage magnitude, e.g., $V_{CCO}$. As discussed in more detail below, delay 138 may be implemented within the delayed data path so as to provide pre-emphasis operation to facilitate frequency dependent compensation when the output signal at output pad 110 is launched onto a printed circuit board trace, or other channel media, that causes signal degradation through, e.g., skin effect. Other uses of the delayed path may include alleviation of simultaneous switching output (SSO) noise, since programmable amounts of delay may be utilized to substantially remove the simultaneity of the data transitions between two or more transmission channels.

Figure 2:
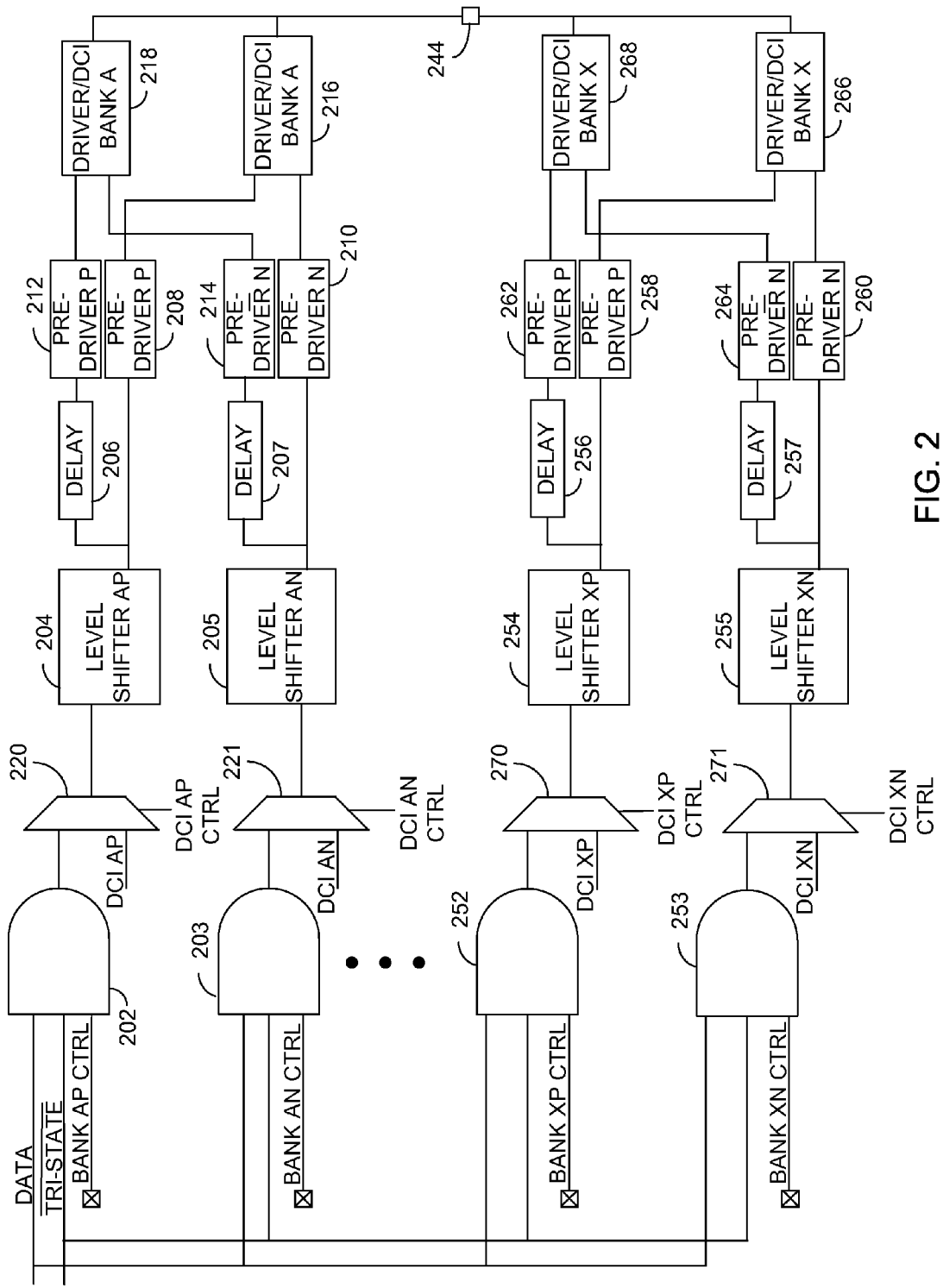
FIG. 2 illustrates detailed aspects of the semiconductor device of FIG. 1.

Turning to FIG. 2, detailed aspects of output buffer 104 are illustrated. Output buffer 104 consists of a plurality of data paths A through X, where only two of the data paths, e.g., A and X, are illustrated for clarity. As discussed in more detail below, any number of data paths may exist within output buffer 104 as may be required by a particular I/O standard. AND gates 202/203, 252/253 and multiplexers 220/221, 270/271 illustrate one embodiment of control block 112, which as discussed in more detail below, operates to: disable the data path via signal TRI-STATE; control the drive level of the data path via signal BANK CTRL; and control the impedance of the data path via signals DCI and DCI CTRL.

Pre-drivers 208 and 210 provide the inputs to driver bank 216 for non-delayed data path A. Similarly, pre-drivers 258 and 260 provide the inputs to driver bank 266 for non-delayed data path X. Driver banks 218 and 268 similarly receive the outputs of pre-drivers 212/214 and 262/264 for the delayed A and X data paths, respectively. The outputs of driver banks 216-218 and 266-268 are connected to output pad 244.

In operation, any number of data paths A through X may be configured within output buffer 104, so as to generate the required drive current, i.e., $I_{OH}$ and $I_{OL}$, at output pad 244 as may be required by the particular I/O standard. In addition, if the I/O standard requires on-die impedance terminations, then the impedance level at output pad 244 may also be configured as necessary. That is to say, in other words, that any one or more of data paths A through X may be configured to set the required drive current, i.e., $I_{OH}$ and $I_{OL}$, at output pad 244, while the remaining data paths A through X may be optionally configured to set the correct impedance at output pad 244.

Figure 3:
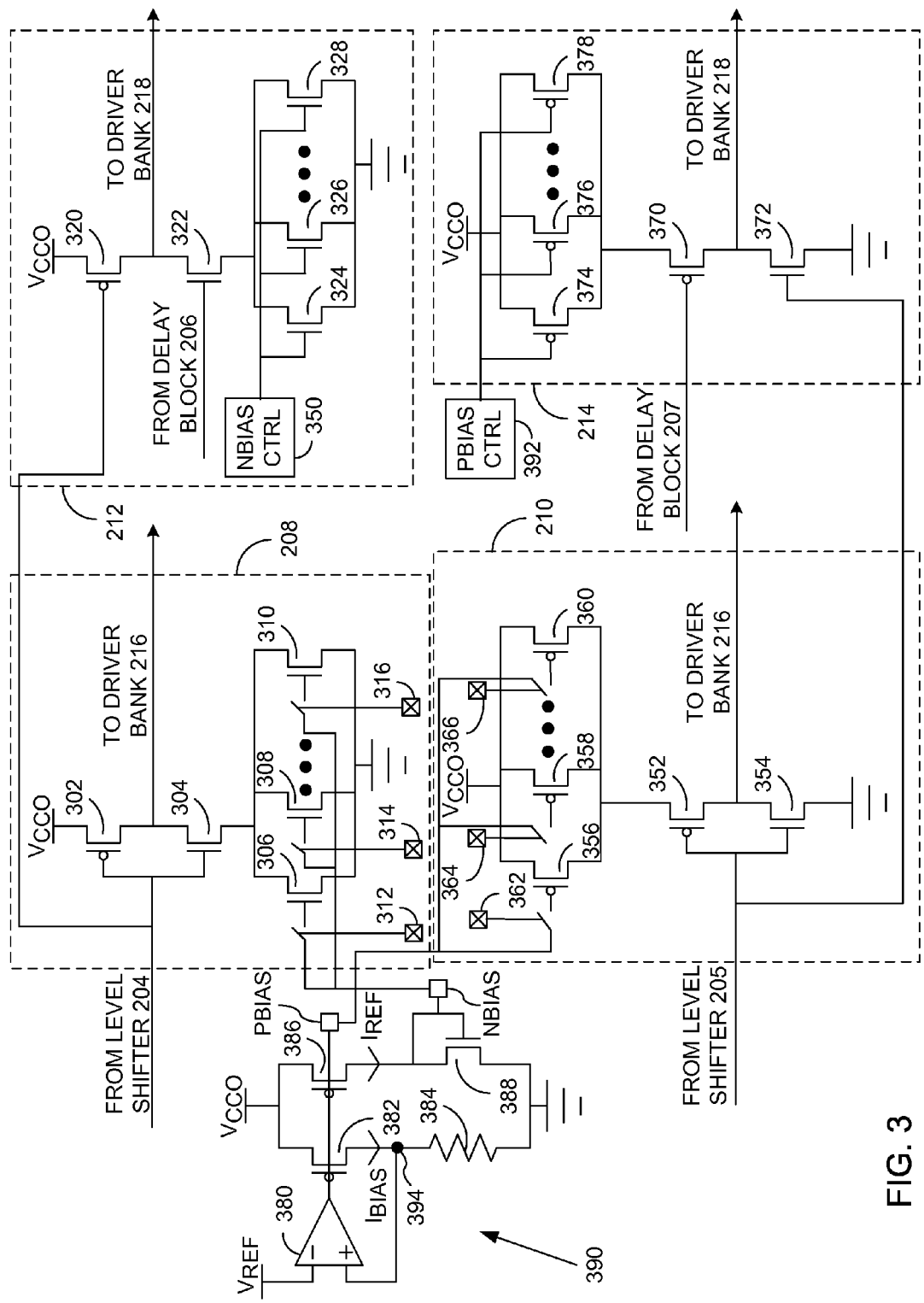
FIG. 3 illustrates a schematic diagram of a pre-driver contained within the semiconductor device of FIG. 2 that is tolerant to PVT variation in accordance with one embodiment of the present invention.

Turning to FIG. 3, schematic diagrams of pre-driver P 208, pre-driver P 212, pre-driver N 210, and pre-driver N 214 for data path A of FIG. 2 are illustrated. It is understood that pre-driver P 258, pre-driver P 262, pre-driver N 260, and pre-driver N 264 for data path X, as well as the P and N pre-drivers (not shown) for the other data paths of FIG. 2, are identical to P and N pre-drivers as illustrated in FIG. 3.

Pre-driver P 208 and pre-driver P 212 may be configured as inverters, whereby p-type metal oxide semiconductor (PMOS) transistors 302,320 and n-type metal oxide semiconductor (NMOS) transistors 304,322 are coupled as shown to provide inverting operations. Similarly, pre-driver N 210 and pre-driver N 214 may be configured as inverters, whereby PMOS transistors 352,370 and NMOS transistors 354,372 are coupled as shown to provide inverting operations.

Configuration memory cells 312-316 are configured to determine which gate terminals of transistors 306-310 are to receive the slew-rate control signal, NBIAS, as generated by slew-rate control 390. NBIAS CTRL 350 implements identical memory cells and associated switching to determine which of transistors 324-328 are to receive the slew-rate control signal, NBIAS, at their respective gate terminals.

Configuration memory cells 362-366 are similarly configured to determine which gate terminals of transistors 356-360 are to receive the slew-rate control signal, PBIAS, as generated by slew-rate control 390. PBIAS CTRL 392 implements identical memory cells and associated switching to determine which of transistors 374-378 are to receive the slew-rate control signal, PBIAS, at their respective gate terminals.

In operation, slew-rate control 390 operates to provide voltage signals, PBIAS and NBIAS, that are substantially independent of PVT variation. In particular, signal $V_{REF}$ is generated by a band gap reference generator, or other PVT invariant generator, such that the magnitude of signal $V_{REF}$ remains substantially constant over a PVT variation range. Through voltage feedback, op amp 380 stabilizes the voltage across resistive device 384 at node 394 to be substantially equal to the PVT invariant voltage magnitude, $V_{REF}$. In response, a constant current signal, $I_{BIAS}$, is caused to be conducted through transistor 382, which is in turn mirrored by transistor 386 to conduct a constant current signal, $I_{REF}$.

Through appropriate selection of the magnitude of signal, $V_{REF}$, virtually any magnitude of current signal, $I_{BIAS}$, may be conducted by transistor 382. Through voltage feedback, the voltage magnitude of signal, PBIAS, remains substantially independent of PVT variation, thereby producing current signal, $I_{BIAS}$, that is also substantially independent of PVT variation. As can be seen, through appropriate sizing of transistor 386, virtually any magnitude of current signal, $I_{REF}$, may be mirrored from current signal, $I_{BIAS}$, to select the PVT invariant voltage magnitude for signal, NBIAS. As a result, voltage signal, PBIAS, that is substantially independent of PVT variation may be selectively applied to the gate terminals of transistors 356-360 and 374-378 via configuration memory cells 362-366 and PBIAS CTRL 392 to yield PVT variation independent slew-rate control. Similarly, voltage signal, NBIAS, that is substantially independent of PVT variation may be selectively applied to the gate terminals of transistors 306-310 and 324-328 via configuration memory cells 312-316 and NBIAS CTRL 350 to yield PVT variation independent slew-rate control.

In one embodiment, the geometries of transistors 306-310 vary, such that the magnitude of source-drain current, $I_{DS}$, provided by transistor 306 is, e.g., twice the magnitude of $I_{DS}$ provided by transistor 308. Similarly, the magnitude of $I_{DS}$ provided by transistor 308 is, e.g., twice the magnitude of $I_{DS}$ provided by transistor 310. As such, the magnitude of current conducted through transistor 304 may be programmed in a binary fashion through appropriate selection of the conductive states of transistors 306-310. The geometries of transistors 324-328 may be similarly weighted, so that the magnitude of current conducted through transistor 322 may be similarly programmed in a binary fashion. Accordingly, the slew rate of output voltage high to output voltage low of pre-drivers 208 and 212 may be programmably configured. Furthermore, once programmably configured, the high to low slew rate of pre-drivers 208 and 212 is substantially independent of PVT variation.

If a slow slew rate is required by the selected I/O standard, for example, then perhaps only a single transistor, e.g., transistors 310 and 328, may be rendered conductive by bias signal, NBIAS, as provided by slew-rate control 390 via configuration memory cells 312-316 and NBIAS CTRL 350. In such an instance, the time required to slew the output of pre-driver P 208 and pre-driver P 212, respectively, from a logic high value to a logic low value may be maximized. If a fast slew rate is required by the selected I/O standard, on the other hand, then perhaps all transistors, e.g., transistors 306-310 and 324-328, may be rendered conductive by bias signal, NBIAS, as provided by slew-rate control 390 via configuration memory cells 312-316 and NBIAS CTRL 350. In such an instance, the time required to slew the output of pre-driver P 208 and pre-driver P 212, respectively, from a logic high value to a logic low value may be minimized.

The geometries of transistors 356-360 may also vary, such that the magnitude of source-drain current, $I_{DS}$, provided by transistor 356 is, e.g., twice the magnitude of $I_{DS}$ provided by transistor 358. Similarly, the magnitude of $I_{DS}$ provided by transistor 358 is, e.g., twice the magnitude of $I_{DS}$ provided by transistor 360. As such, the magnitude of current conducted through transistor 352 may be programmed in a binary fashion through appropriate selection of the conductive states of transistors 356-360. The geometries of transistors 374-378 are similarly weighted, so that the magnitude of current conducted through transistor 370 may be similarly programmed in a binary fashion. Accordingly, the slew rate of the outputs of pre-driver N 210 and pre-driver N 214 may be programmably configured.

If a slow slew rate is required by the selected I/O standard, for example, then perhaps only a single transistor, e.g., transistors 360 and 378, may be rendered conductive by bias signal, PBIAS, as provided by slew-rate control 390 via configuration memory cells 362-366 and PBIAS CTRL 392. In such an instance, the time required to slew the output of pre-driver N 210 and pre-driver N 214, respectively, from a logic low value to a logic high value may be maximized. If a fast slew rate is required by the selected I/O standard, on the other hand, then perhaps all transistors, e.g., transistors 356-360 and 374-378, may be rendered conductive by bias signal, PBIAS, as provided by slew-rate control 390 via configuration memory cells 362-366 and PBIAS CTRL 392. In such an instance, the time required to slew the output of pre-driver N 210 and pre-driver N 214, respectively, from a logic low value to a logic high value may be minimized.

It can be seen, therefore, that by operation of the configuration memory cell and switching arrangements of FIG. 3, slew rate may be programmably configured in response to the particular rise-time and fall-time values that are required by the selected I/O standard. In addition, slew-rate control is made to be substantially independent of PVT variation through operation of bias signals, PBIAS and NBIAS, as provided by slew-rate control 390.

Figure 4:
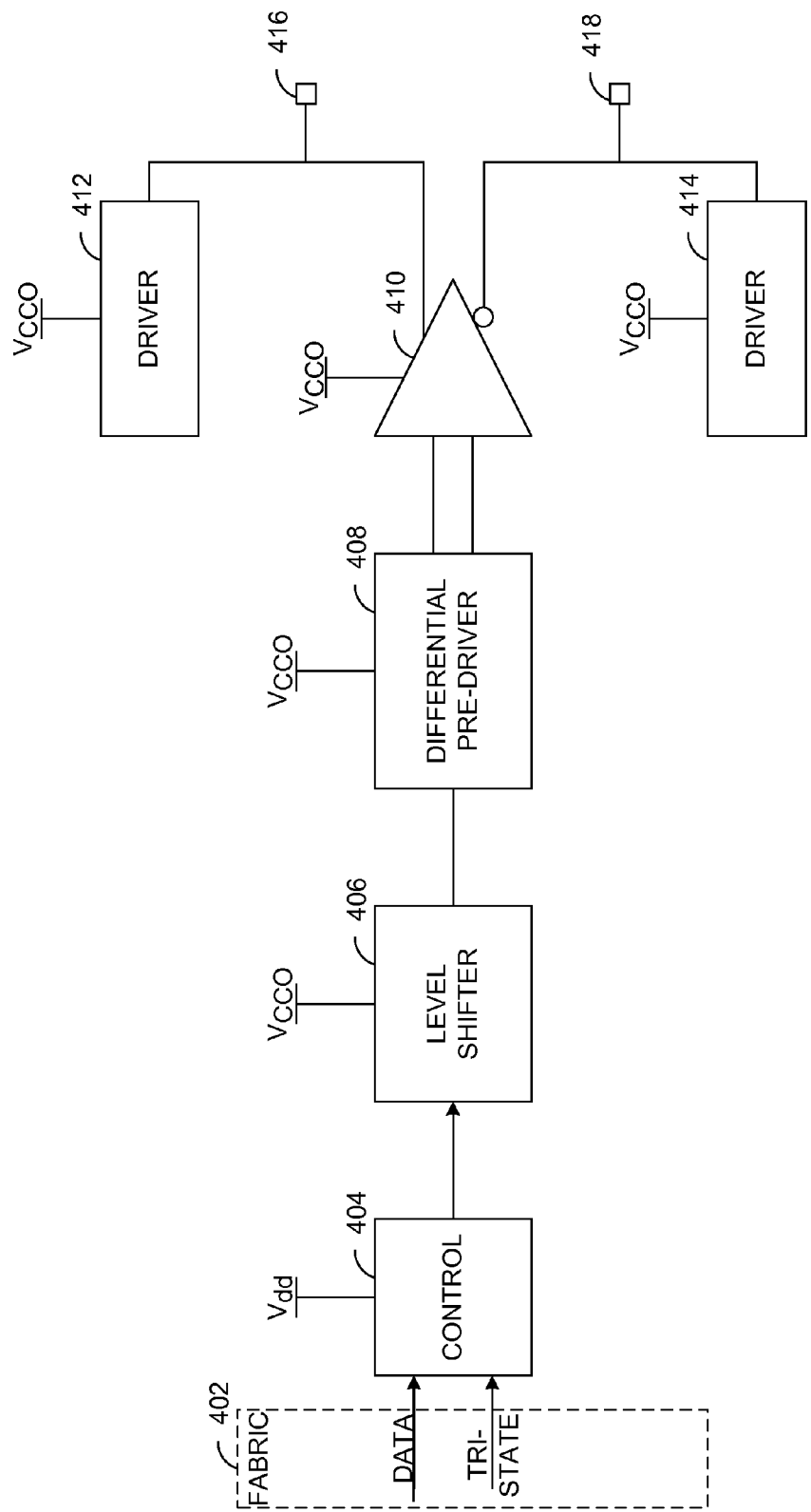
FIG. 4 illustrates a block diagram of an alternate semiconductor device that may exhibit performance degradation induced by process, voltage, and temperature (PVT) variation.

Turning to FIG. 4, a block diagram of a differential I/O buffer is illustrated, whereby differential I/O standards, such as low-voltage differential signaling (LVDS), LVDS extended, and hypertransport protocol (HT) may be similarly configured within an FPGA. Drivers 412 and 414 are identical to output buffer 104 of FIG. 1, whereby in operation, drivers 412 and 414 are tri-stated, so as to allow differential amplifier 410 to drive output pads 416 and 418. The operation of control block 404, level shifter 406, and differential pre-driver 408 are substantially equivalent to the operation of control block 112, level shifter 114, and pre-driver 116 as discussed above in relation to FIGS. 1-3.

Figure 5:
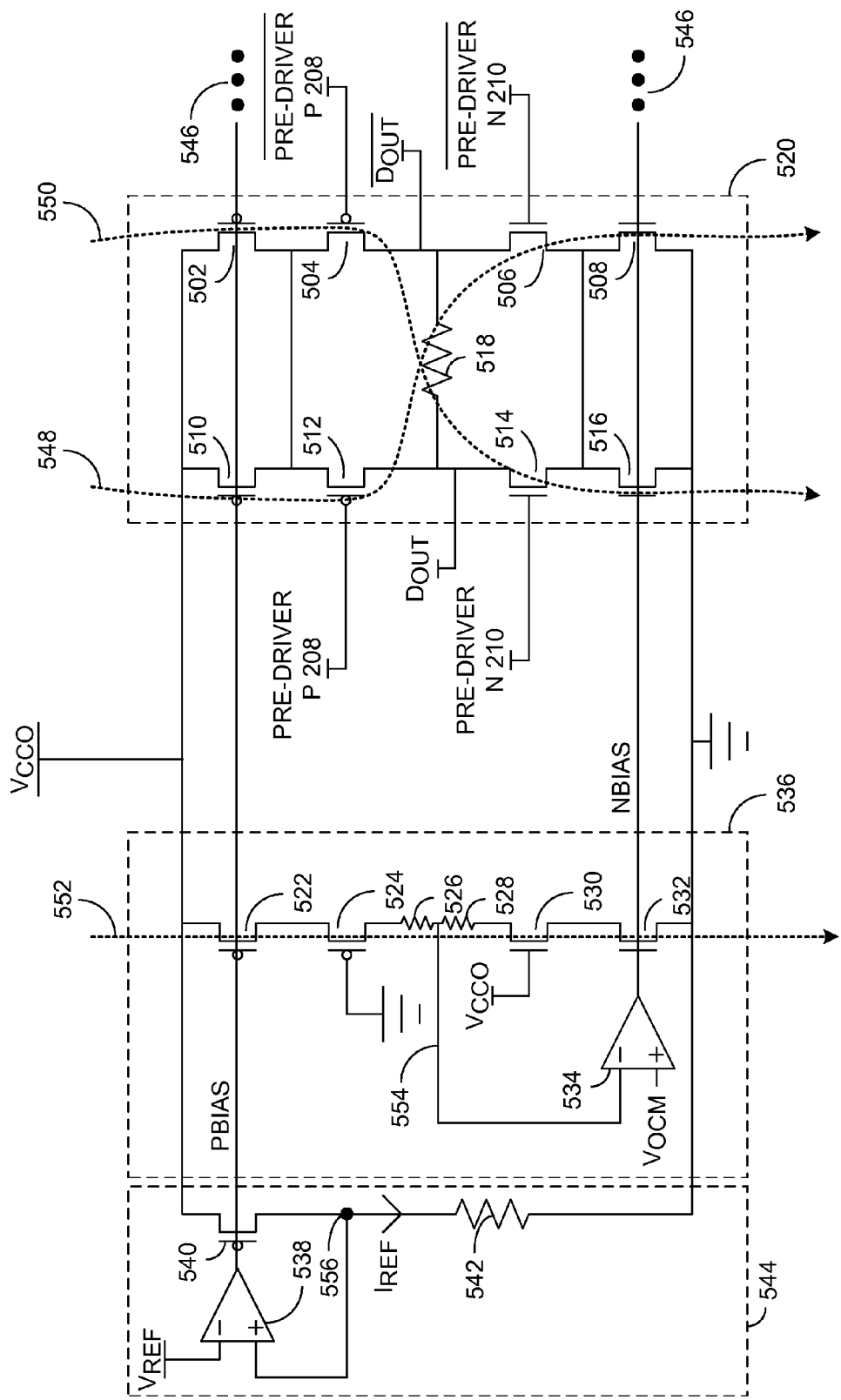
FIG. 5 illustrates a schematic diagram of a driver contained within the semiconductor device of FIG. 4 that is tolerant to PVT variation in accordance with an alternate embodiment of the present invention.

FIG. 5 illustrates a schematic diagram of a differential driver in accordance with one embodiment of the present invention in which the differential driver of FIG. 4 is configured for use with, e.g., the LVDS I/O standard. The differential driver of FIG. 5 is comprised of three sections: differential amplifier 520 of differential amplifier bank 546, common mode control block 536, and reference current control block 544.

In operation, differential amplifier 520 receives input data from respective N and P pre-drivers as discussed above in relation to FIG. 2. For example, differential input data signals may be received from pre-driver P 208 and pre-driver N 210 as illustrated in FIG. 5. The differential output signal is developed across termination impedance 518, whereby current path 548 is active when transistors 512 and 506 are rendered conductive by the differential input signal from pre-drivers 208 and 210, respectively. Conversely, current path 550 is active when transistors 504 and 514 are rendered conductive by the differential input signal from pre-drivers 208 and 210, respectively.

Common mode control block 536 implements a replica of one arm of differential amplifier 520, such that transistors 522 and 524 replicates either the 510,512 transistor pair or the 502,504 transistor pair of differential amplifier 520. Termination impedances 526 and 528 combine in series to form an impedance magnitude that is substantially equal to the impedance magnitude of termination impedance 518. Transistors 530 and 532 replicates either the 514,516 transistor pair or the 506,508 transistor pair of differential amplifier 520. It can be seen, therefore, that the magnitude of the current signal flowing in current path 552 replicates the magnitude of the current signal flowing in current path 548 or 550 depending upon the conductivity state of differential amplifier 520 as discussed above.

It is noted that the replica implemented by common mode control block 536 may not necessarily be a 1:1 ratio replica, but rather may be implemented as any integer fraction replica. For example, the geometric dimensions of the transistors and reference impedances of common mode control block 536 may be made to be smaller as compared to the geometric dimensions of the corresponding transistors and reference impedances of differential amplifier 520, thereby conserving semiconductor die area and power consumption. It is further noted that only a single replica is needed for a given bank of differential amplifiers, thereby providing the ability to geographically locate the replica away from the differential amplifier bank on the semiconductor die, thereby reducing the ability of noise from the amplifier bank from coupling onto the replica.

In operation, common mode control block 536 utilizes voltage feedback to detect changes in the output common mode voltage that may be exhibited by differential amplifier 520 based upon PVT or other sources of variation. In particular, op amp 534 detects a change in voltage existing between replica impedances 526 and 528 at node 554. Through feedback operation, op amp 534 forces the magnitude of the voltage at node 554 to be substantially equal to the desired output common mode voltage, $V_{OCM}$, which is provided to the non-inverting input of op amp 534.

That is to say, in other words, that the drain-source voltage, $V_{DS}$, across transistor 532 is modulated by op amp 534 via bias signal, NBIAS, to set the voltage at node 554 to be substantially equal to $V_{OCM}$. In one embodiment, the desired output common mode voltage, $V_{OCM}$, may be generated by a PVT invariant voltage generator, such as a band gap reference. As a result, the respective $V_{GS}$ developed across transistors 516,508 is adjusted by common mode control block 536 to force the direct current (DC) component of the output voltage signal developed across termination impedance 518 to be substantially equal to $V_{OCM}$.

Reference current control block 544 similarly utilizes voltage feedback to provide reference current control signal, PBIAS, to common mode control block 536 and differential amplifier 520, so as to maintain the current signal magnitude conducted by current paths 548 and 550 to be substantially equal to the current signal magnitude conducted by current path 552. In particular, op amp 538 forces the voltage developed across reference impedance 542 at node 556 to be substantially equal to reference voltage, $V_{REF}$, which may be generated by a PVT invariant voltage generator, such as a band gap reference.

As a result, a reference current, $I_{REF}$, is generated through transistor 540 that is mirrored by transistor 522 of common mode control block 536 and transistors 510 and 502 of differential amplifier 520. The alternating current (AC) voltage signal generated across termination impedance 518 by the current signal conducted by current paths 548 and 550, therefore, exhibits symmetrical behavior. That is to say, in other words, that the difference between the magnitude of output voltage high, $V_{OH}$ and $V_{OCM}$ is substantially equal to the difference between $V_{OCM}$ and the magnitude of output voltage low, $V_{OL}$, as provided across terminals $D_{OUT}$ and $D_{OUT}$ complement of differential amplifier 520.

It is noted, that signals NBIAS and PBIAS may be distributed to the remaining differential amplifiers of differential amplifier bank 546. As a result, the common mode voltage and output voltage swing of the remaining differential amplifiers of differential amplifier bank 546 may be maintained substantially independent of PVT or other sources of variation as well. It is further noted, that banks of transistors may be utilized within differential amplifier 520, so as to facilitate programmable configuration of the magnitude of current that may be conducted by current paths 548 and 550. That is to say, in other words, that just as banks of transistors may be utilized to facilitate slew-rate control, as discussed above in relation to FIG. 3 for example, so may banks of transistors be utilized to accommodate varying $I_{OH}$ and $I_{OL}$ specifications that are required by the particular I/O standards being implemented by differential amplifier 520.

Figure 6:
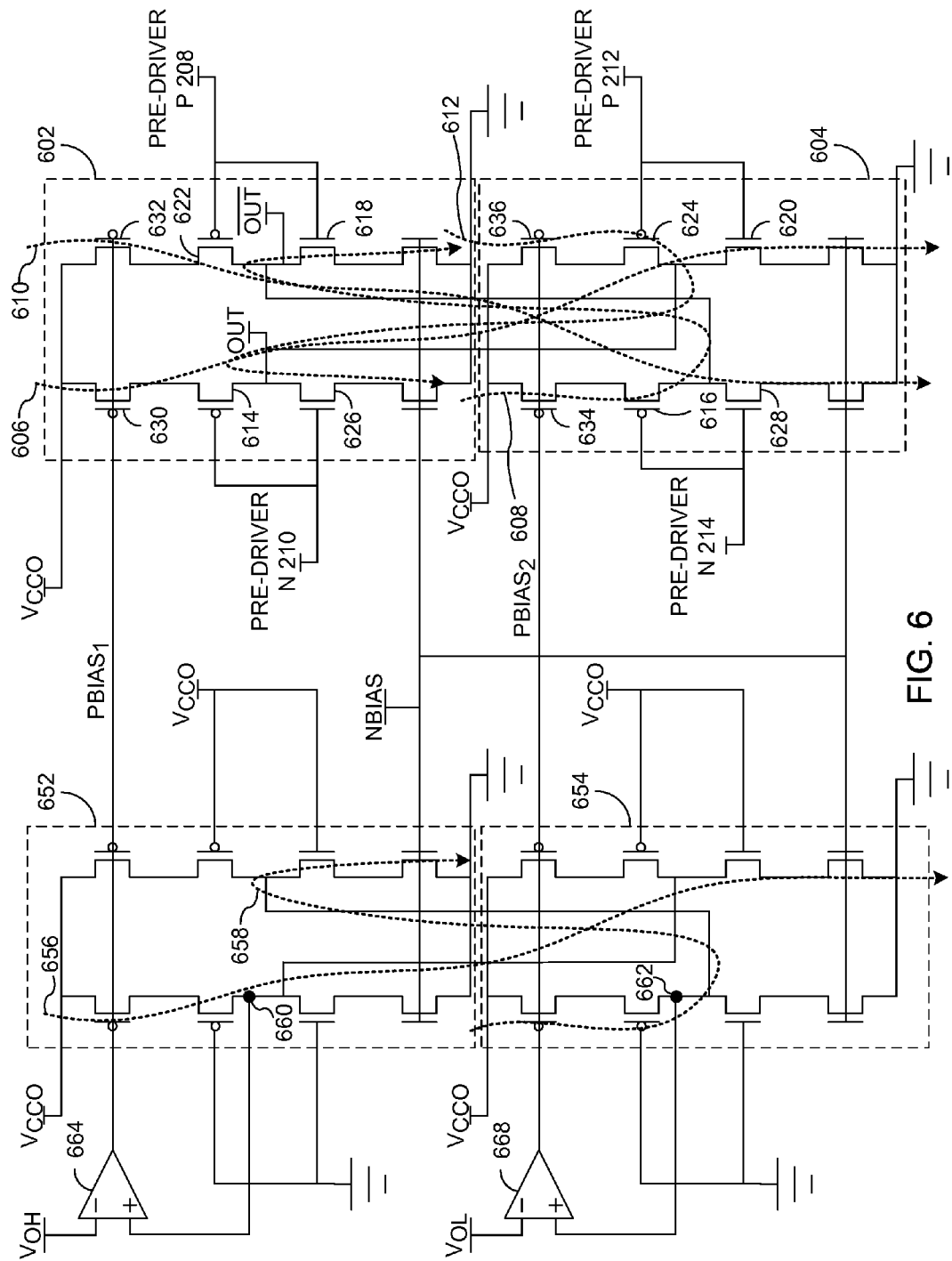
FIG. 6 illustrates a schematic diagram of a driver contained within the semiconductor device of FIG. 4 that is tolerant to PVT variation in accordance with an alternate embodiment of the present invention.

Turning to FIG. 6, an alternate embodiment is illustrated, whereby operation of a differential amplifier may be caused to exhibit substantial independence from PVT or other sources of variation while operating with pre-emphasis, or as an amplifier that alleviates SSO noise. Differential amplifier 602 receives output signals from pre-driver P 208 and pre-driver N 210 as illustrated. Similarly, differential amplifier 604 receives output signals from pre-driver P 212 and pre-driver N 214 as illustrated. It is recognized from FIG. 2, that delays 206 and 207 are utilized to delay the input signals received by differential driver 604 as compared to the input signals received by differential driver 602 for pre-emphasis, or SSO alleviation, purposes.

In a first state of operation, a logic low value generated at the gate terminal of transistor 614 by pre-driver N 210 is simultaneously accompanied by a logic high value generated at the gate terminal of transistor 618 by pre-driver P 208. After an amount of time equal to delay 206 and 207 has transpired, a logic low value generated at the gate terminal of transistor 616 by pre-driver N 214 is simultaneously accompanied by a logic high value generated at the gate terminal of transistor 620 by pre-driver P 212. As a result, DC current paths 606 and 608 are caused to simultaneously exist within differential amplifiers 602 and 604 as illustrated.

In a second state of operation, a logic high value generated at the gate terminal of transistor 626 by pre-driver N 210 is simultaneously accompanied by a logic low value generated at the gate terminal of transistor 622 by pre-driver P 208. After an amount of time equal to delay 206 and 207 has transpired, a logic high value generated at the gate terminal of transistor 628 by pre-driver N 214 is simultaneously accompanied by a logic low value generated at the gate terminal of transistor 624 by pre-driver P 212. As a result, DC current paths 610 and 612 are caused to simultaneously exist within differential amplifiers 602 and 604 as illustrated.

As can be verified, the bias voltage, $PBIAS_1$, present at the gate terminals of transistors 630 and 632 selects the magnitude of current conducted by current paths 606 and 610, respectively. Similarly, the bias voltage, $PBIAS_2$, present at the gate terminals of transistors 634 and 636 selects the magnitude of current conducted by current paths 608 and 612, respectively. Thus, by voltage-feedback adjustment of the magnitude of bias voltages, $PBIAS_1$ and $PBIAS_2$, the magnitude of current conducted by current paths 606 and 610 may be stabilized across all PVT corners. As a result, both the output common mode voltage and the output voltage swing present at terminals OUT and OUT complement may be stabilized across all PVT corners.

Differential amplifiers 652 and 654 are implemented as replicas to differential amplifiers 602 and 604, respectively, such that current signals conducted by current paths 656 and 658 replicate the current signals conducted by current paths 606 and 608 as well as current paths 610 and 612. It is noted that the replicas implemented by differential amplifiers 652 and 654 may not necessarily be 1:1 ratio replicas, but rather may be implemented as any integer fraction replicas. For example, the geometric dimensions of the transistors of replica differential amplifiers 652 and 654 may be made to be smaller as compared to the geometric dimensions of the corresponding transistors of differential amplifiers 602 and 604, respectively. As a result, semiconductor die area and power consumption may be conserved. It is further noted that only a single pair of replica differential amplifiers are needed for a given bank of differential amplifiers, thereby providing the ability to geographically locate the replica pair away from the differential amplifier bank on the semiconductor die, thereby reducing the ability of noise from the amplifier bank from coupling onto the replica pair.

Through voltage feedback, op amp 664 maintains the voltage magnitude at node 660 to be substantially equal to $V_{OH}$, where $V_{OH}$ may be generated by a PVT invariant voltage generator, such as a band gap reference. As a result, signal $PBIAS_1$ is maintained at a voltage magnitude that maintains the current conducted by current path 656 to be substantially independent of PVT variation. Since the current conducted by transistors 630 and 632 mirrors the current conducted by current path 656, then current paths 606 and 610 also conduct a magnitude of current that is substantially independent of PVT variation.

Through voltage feedback, op amp 668 similarly maintains the voltage magnitude at node 662 to be substantially equal to $V_{OL}$, where $V_{OL}$ may be generated by a PVT invariant voltage generator, such as a band gap reference. As a result, signal $PBIAS_2$ is maintained at a voltage magnitude that maintains the current conducted by current path 658 to be substantially independent of PVT variation. Since the current conducted by transistors 634 and 636 mirrors the current conducted by current path 658, then current paths 608 and 612 also conduct a magnitude of current that is substantially independent of PVT variation.

It is noted that voltage signal, NBIAS, may also be generated by a PVT invariant voltage generator so as to maintain the requisite conductivity state of the tail transistors of differential amplifiers 602,604 and replica differential amplifiers 652,654 for proper operation. In an alternate embodiment, signals $PBIAS_1$ and $PBIAS_2$ may instead be generated using PVT invariant voltage generators. In such an embodiment, op amps 664 and 668 may instead be used to control, via voltage feedback, the potential at nodes 660 and 662 such that the current conducted by current paths 606-612 in response to bias signal, NBIAS, may be stable across all PVT corners.

Figure 7:
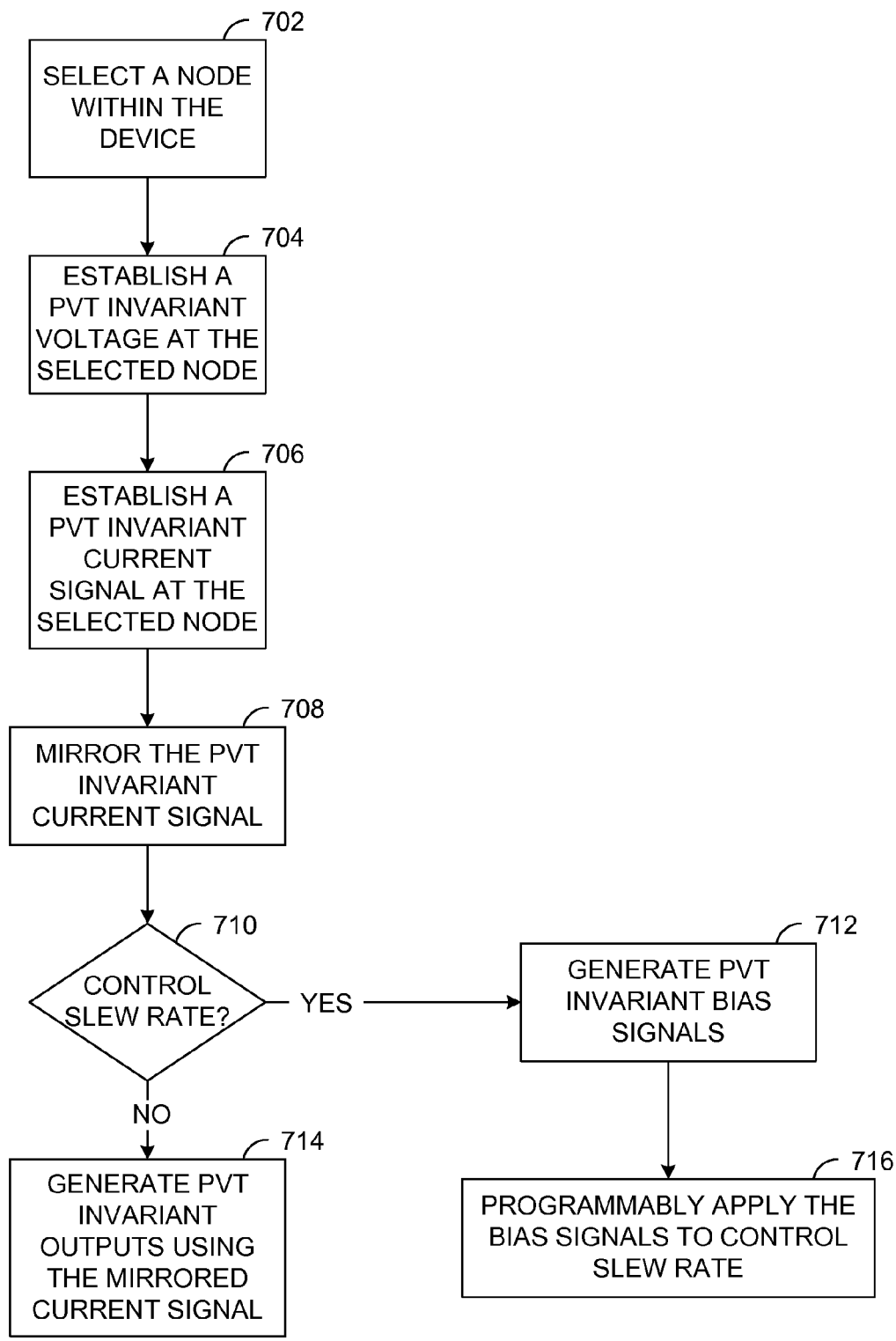
FIG. 7 illustrates a flow diagram of a method of providing semiconductor device operation that is substantially independent of PVT or other types of variation in accordance with the various embodiments of the present invention.

Turning to FIG. 7, a flow diagram of a method of providing semiconductor device operation that is substantially independent of PVT or other types of variation is illustrated. In steps 702-704, a node is selected within a device that requires a substantially PVT invariant voltage. The PVT invariant voltage is then generated through voltage feedback at the selected node. In step 706, a PVT invariant current is conducted through the node selected in step 702 by operation of the voltage-feedback operation. In particular, an op amp may be utilized to control the conductivity state of a transistor, such that the current generated by the transistor in response to the bias signal provided by the op amp is conducted through the node to establish the PVT invariant voltage at the node. The conductivity state of other transistors may then be controlled by the bias signal so as to mirror the current conducted through the node as in step 708.

In certain embodiments, such as for slew-rate control as in step 710, the bias signal generated by the op amp in step 712 is utilized to control the conductivity state of head current sources contained within a driver circuit, thereby controlling the slew rate of the driver circuit. An additional bias signal is generated in step 712 from the mirrored current signal to control tail current sources within a driver circuit, thereby similarly controlling the slew rate of the driver circuit.

In alternate embodiments, the mirrored current signal is generated in a replica circuit and a driver circuit, where each mirrored current signal is PVT invariant. The replica circuit may be implemented as a 1:1 replica or a smaller ratio replica. Smaller replica circuits, for example, may be implemented using smaller semiconductor device geometries as compared to the semiconductor device geometries of the driver circuit, which is effective to reduce both the semiconductor die area and the power required by the replica. The current signal mirrored by the driver circuit is then utilized to generate PVT invariant output signals as in step 714.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of providing process, voltage, and temperature variation tolerance within a semiconductor device, the method comprising:

establishing a variation tolerant voltage signal at a selected node within a first device;

conducting a first variation tolerant current signal through the selected node;

mirroring the first variation tolerant current signal to conduct a second variation tolerant current signal;

generating a first bias voltage from the second variation tolerant current signal;

programmably applying the first bias voltage to control a slew rate of a second device;

generating a third variation tolerant current signal;

mirroring the third variation tolerant current signal to generate a fourth variation tolerant current signal through a common mode voltage node, wherein a voltage generated across a termination impedance of outputs of a differential amplifier in a common mode is substantially equal to a common mode voltage generated at the common mode voltage node; and utilizing the common mode voltage at the common mode voltage node to detect changes in the output of the differential amplifier.

2. The method of claim 1, wherein establishing a variation tolerant voltage signal at a selected node within a first device comprises:

comparing the variation tolerant voltage signal to a variation tolerant reference signal to generate a second bias voltage;

controlling the conductivity state of a first transistor in response to the second bias voltage to adjust a magnitude of the first variation tolerant current signal; and selecting a magnitude of the variation tolerant voltage signal to be substantially equal to the variation tolerant reference signal in response to the conductivity state of the first transistor.

3. The method of claim 2, wherein mirroring the first variation tolerant current signal to conduct a second variation tolerant current signal comprises controlling the conductivity state of a second transistor in response to the second bias voltage to adjust a magnitude of the second variation tolerant current signal to be substantially proportional to the magnitude of the first variation tolerant current signal.

4. The method of claim 2, wherein programmably applying the first bias voltage to control a slew rate of a second device comprises:

applying the first bias voltage to a first bank of switches;

programming configuration memory cells to select the conductivity state of each switch of the first bank of switches;

controlling a magnitude of current conducted by each transistor of a first bank of transistors in response to applying the first bias voltage to a gate terminal of each transistor of the first bank of transistors; and wherein the first bias voltage is programmably applied to the gate terminal of each transistor of the first bank of transistors in response to the conductivity state of a corresponding switch of the first bank of switches.

5. The method of claim 4, further comprising programmably applying the second bias voltage to control a slew rate of a third device.

6. The method of claim 5, wherein programmably applying the second bias voltage to control a slew rate of a third device comprises:

applying the second bias voltage to a second bank of switches;

programming configuration memory cells to select the conductivity state of each switch of the second bank of switches;

controlling a magnitude of current conducted by each transistor of a second bank of transistors in response to applying the second bias voltage to a gate terminal of each transistor of the second bank of transistors; and wherein the second bias voltage is programmably applied to each gate terminal of the second bank of transistors in response to the conductivity state of a corresponding switch of the second bank of switches.

7. A bias signal generator, comprising:

a reference generator adapted to provide a reference voltage that is substantially independent of process, voltage, and temperature variation;

a first operational amplifier having a first input coupled to receive the reference voltage and an output adapted to provide a first bias signal, the first bias signal being substantially independent of process, voltage, and temperature variation;

a first current conduction device coupled to receive the first bias signal and adapted to conduct a first current signal in a first current path in response to the first bias signal, wherein a magnitude of the first current signal is adapted to be substantially independent of process, voltage, and temperature variation;

a second current conduction device coupled to receive the first bias signal and adapted to conduct a second current signal in a second current path in response to the first bias signal, wherein the first current signal is mirrored in the second current conduction device and a magnitude of the second current signal is adapted to be proportional to a magnitude of the first current signal; and a second operational amplifier coupled to receive a common mode voltage generated at a common mode voltage node of the second current path, wherein the second operational amplifier maintains the common mode voltage at the common mode voltage node at a desired common mode voltage, wherein a voltage generated across a termination impedance of outputs of a differential amplifier in a common mode is substantially equal to the common mode voltage generated at the common mode voltage node.

8. The bias signal generator of claim 7, wherein the reference generator includes a band gap reference generator.

9. The bias signal generator of claim 7, wherein a second input of the first operational amplifier is coupled to receive a feedback signal at a first node that is indicative of the magnitude of the first current signal.

10. The bias signal generator of claim 9, wherein the first current conduction device comprises:

a first transistor having a first terminal coupled to receive a power supply signal, a second terminal coupled to the first node, and a control terminal coupled to receive the first bias signal; and a resistive device having a first terminal coupled to the first node, the resistive device being adapted to provide the feedback signal to the first node.

11. The bias signal generator of claim 10, wherein the second current conduction device comprises:

a second transistor having a first terminal coupled to receive the power supply signal and a control terminal coupled to receive the first bias signal.

12. An integrated circuit, comprising:

an output buffer coupled to receive a data signal from a core of the integrated circuit and adapted to transmit the data signal;

a slew-rate control block coupled to provide first and second bias signals to the output buffer that are substantially independent of process, voltage, and temperature variation, the slew-rate control block including, a first current conduction device coupled to receive the first bias signal and adapted to conduct a first current signal in response to the first bias signal, wherein a magnitude of the first current signal is adapted to be substantially independent of process, voltage, and temperature variation; and a second current conduction device coupled to receive the first bias signal and adapted to conduct a second current signal in response to the first bias signal, wherein a magnitude of the second current signal is adapted to be proportional to a magnitude of the first current signal;

a reference current control block coupled to receive a reference voltage and generate a third current signal; and a common mode control block coupled to provide a common mode voltage to the output buffer, the common mode control block having an operational amplifier coupled to receive a common mode voltage generated at a common mode voltage node, wherein the third current signal is mirrored in the common mode control block, and wherein the operational amplifier maintains the common mode voltage at the common mode voltage node at a desired common mode voltage for controlling a differential amplifier, wherein a voltage generated across a termination impedance of outputs of the differential amplifier operating in a common mode is substantially equal to the common mode voltage generated at the common mode voltage node.

13. The integrated circuit of claim 12, wherein the slew-rate control block further includes a reference generator adapted to provide a reference voltage that is substantially independent of process, voltage, and temperature variation.

14. The integrated circuit of claim 13, wherein the reference generator includes a band gap reference generator.

15. The integrated circuit of claim 13, wherein the slew-rate control block further includes a second operational amplifier having a first input coupled to receive the reference voltage and an output adapted to provide the first bias signal.

16. The integrated circuit of claim 15, wherein a second input of the second operational amplifier is coupled to receive a feedback signal at a first node that is indicative of the magnitude of the first current signal.

17. The integrated circuit of claim 16, wherein the second operational amplifier is adapted by the feedback signal to maintain a substantially constant magnitude of the first current signal.

18. The integrated circuit of claim 17, wherein the first current conduction device comprises:

a first transistor having a first terminal coupled to receive a power supply signal, a second terminal coupled to the first node, and a control terminal coupled to receive the first bias signal; and a resistive device having a first terminal coupled to the first node, the resistive device being adapted to provide the feedback signal to the first node.

19. The integrated circuit of claim 18, wherein the second current conduction device comprises:

a second transistor having a first terminal coupled to receive the power supply signal and a control terminal coupled to receive the first bias signal; and a third transistor having a first terminal coupled to a second terminal of the second transistor at a second node and a control terminal coupled to the second node, the third transistor being adapted to provide the second bias signal at the second node.

20. The integrated circuit of claim 19, further comprising:

a first bank of transistors programmably coupled to receive the first bias signal and adapted to adjust a rise time of the transmitted data signal in response to the first bias signal; and a second bank of transistors programmably coupled to receive the second bias signal and adapted to adjust a fall time of the transmitted data signal in response to the second bias signal.

\* \* \* \* \*